United States Patent [19]
Kondo et al.

[11] Patent Number: 5,360,765
[45] Date of Patent: Nov. 1, 1994

[54] METHOD OF FORMING ELECTRODES OF SEMICONDUCTOR DEVICE

[75] Inventors: Ichiharu Kondo, Nagoya; Takao Yoneyama, Sunomata; Masami Yamaoka, Anjo, all of Japan

[73] Assignee: Nippondenso Co., Ltd., Kariya, Japan

[21] Appl. No.: 914,623

[22] Filed: Jul. 17, 1992

[30] Foreign Application Priority Data

Jul. 17, 1991 [JP] Japan .................. 3-176870
Nov. 12, 1991 [JP] Japan .................. 3-295897

[51] Int. Cl.$^5$ .......................... H01L 29/08
[52] U.S. Cl. .................... 437/192; 437/946; 437/187; 204/192.1; 204/192.3
[58] Field of Search ........... 437/946, 192, 187; 204/192.3, 192.1

[56] References Cited

U.S. PATENT DOCUMENTS

| | | | |
|---|---|---|---|
| 3,461,054 | 8/1969 | Vratny | 204/192.15 |
| 3,516,915 | 6/1970 | Mayer et al. | 204/192.15 |
| 3,945,903 | 3/1976 | Svendor et al. | 204/192.15 X |
| 3,982,908 | 9/1976 | Arnold . | |
| 4,513,905 | 4/1985 | Nowichi et al. | 204/192.15 X |
| 4,588,343 | 5/1986 | Garrett | 204/298 MC |
| 4,856,326 | 8/1989 | Tsukamoto . | |
| 4,994,880 | 2/1991 | Kato et al. | 357/34 |

FOREIGN PATENT DOCUMENTS

| | | |
|---|---|---|
| 0330122 | 8/1989 | European Pat. Off. . |
| 56-142633 | 11/1981 | Japan . |
| 0019778 | 1/1986 | Japan . |
| 63-290268 | 11/1988 | Japan . |
| 2167890 | 6/1990 | Japan . |

OTHER PUBLICATIONS

"Method to Fabricate Low Stress Refractory Metal Silicide Films", IBM Technical Disclosure Bulletin, vol. 32 No. 68 Nov. 1989, p. 190.

A. L. De Laere et al, "On the influence of the surface pretreatment of a Si substrate of cobalt silicon formation", Semiconductor Science and Technology, 1990 Jul. No. 7, pp. 745–751.

Patent Abstracts of Japan, vol 14 No. 541(E–1007) Nov. 1990 re JP-A-2230756 "Copper Electrode Wiring Material", Iwamatsu Seiichi.

T. Yoneyama et al, "Thin Film Structure and Adhesive of Sputtered Ti–Ni Layers of Silicon", Thin Solid Films 1990 Dec. Nos. 1/2, pp. 1056–1064.

Patent Abstract of Japan, vol. 011 No. 59(E–482) Feb. 1987 re JP-A-61 220 344 "Manufacture of Semiconductor Device", Aimi Toshihiki, et al.

(List continued on next page.)

Primary Examiner—Olik Chaudhuri
Assistant Examiner—C. Everhart
Attorney, Agent, or Firm—Cushman, Darby & Cushman

[57] ABSTRACT

A method for forming electrodes with strong adhesion strength for a semiconductor device is provided. The adhesion strength between a Si substrate and a Ti film is made higher than the pulling stress of a Ni film. Before an electrode is formed using sputtering process, the natural oxide film grown on a semiconductor substrate is removed using an Ar reverse sputtering while the top surface of the silicon substrate is converted to an amorphous through a bombardment and introduction of Ar. While Ti is deposited, a Si-Ti amorphous layer is formed in the Si/Ti interface. In this case, the amount of Ar atoms is controlled less than $4.0 \times 10^{14}$ atoms/cm$^2$. The Ar amount also can be controlled by adjusting the conditions such as the output or cathodic voltage of Ar reverse sputtering and decreasing the absolute value of Ar in the amorphous Si layer. Also the Ar amount can be controlled by diffusing Ar atoms into the substrate at more than about 300° C. during Ti film deposition to diverse the Ar distribution. As a result argon atoms which concentrates at the interface do not affect with respect to the Si-Ti amorphous layer, whereby the bonding strength of the amorphous layer is maintained. Therefore, the strong adhesion strength between Si and Ti can provide a sufficient durability against the film stress of the Ni film.

19 Claims, 8 Drawing Sheets

OTHER PUBLICATIONS

Sugita "Laminated Amorphous Semiconductor Film Mfr." Jan. 28, 1986, Chem. Abs. CA 105(2):16510p.

Sugita "Laminated Amorphou Semiconductor Film Mfr." Jan. 28, 1986, Derwent Abs. C86-028731.

HRTEM and Nano-Scale Micro Analysis of the Titanium/Silicon Interfacial Reaction Correlated with Correlated with Electrical Properties., Shin-ichi Ogawa et al, pp. 429–432 22nd Conf. on Solid State Devices Sendai (1990).

Adhesion Studies of Magnetron-Sputtered Copper Films on Nickel Substrates: Effects of Substrate Surface Pretreatments. G. H. Lee et al, pp. 21–33, Thin Solid Films 185(1990).

Silicide Formation From Ternary Metal-Metal-Silicon Systems, M. Setton et al pp. 351–363 Thin Solid Films 156(1988).

John A. Thornton et al, Internal Stresses in Titanium Nickel, Molybdenum and Tantalum films Deposited by Cylindrical Magnetron Sputtering, Journal of Vacuum Science and Technology, Jan./Feb. 1977, pp. 164–168.

B. Navinsek, Stainless-Steel, Nickel and Brass Protective Film Produced by Cathode Sputtering, Thin Solid FIlms, Nov. 15, 1972, pp. 367–372.

Y.-K. Chao et al, Porosity in Thin Ni/Au Metallization Layers, Journal of Vacuum Science & Technology, May/Jun. 1987, pp. 337–342.

Donald L. Packwood et al, Contact Metallization for Producing Stable Bipolar Microwave Transistors, Journal of Vacuum and Technology, May/Jun. 1985, pp. 799–802.

P. V. Plunkett et al, Stresses in Sputter-Deposited Nickel and Copper Oxide Thin films, Thin Solid Films Nov. 1979, pp. 121–128.

S. Shinzato et al, Proc 7th ICVM, 1982 Tokyo Japan pp. 172–179.

D. W. Hoffmann et al, Thin Solid Films. 45 (1977) pp. 387–396.

J. A. Thornton et al, J. Vac Sci Technol. vol. No. 1, Jan./Feb. 1977 pp. 164–168.

D. W. Hoffman et al, J. Vc Sci. Technol. 20 (3) pp. 613–618 (1977).

Yoneyama et al, Thin film Structure and adhesion of Sputtered Ti-Ni Layers on Silicon, Thin Solid Films 193/194 (1990) pp. 1056–1064.

Kondo, et al., "Effects of different pretreatments on the surface structure of silicon and adhesion of metal films" J. Vac. Sci Technol. A 10(5), Sep./Oct. 1992 pp. 3166–3170.

FIG. 9b Ti-Ni-Au FORMATION

FIG. 9c PEEL-TEST

FIG. 9g Ti-Ni-Au FORMATION

FIG. 9h PEEL-TEST

FIG. 9l Ti-Ni-Au FORMATION

FIG. 9m PEEL-TEST

FIG. 9n

METHOD OF FORMING ELECTRODES OF SEMICONDUCTOR DEVICE

BACKGROUND OF THE INVENTION

1. Field of the Invention

The present invention relates to a method of forming electrodes of a semiconductor device, and particularly to a method in which adhesive property to a Si substrate is high and is suitable when it is used for forming a back electrode of power devices.

2. Description of the Related Art

Conventionally, the method of manufacturing laminated metal electrode wherein a titanium film, a nickel film, and a gold film are formed sequentially on a semiconductor wafer using sputtering process or vapor deposition process has been well-known. However, there is a disadvantage such that a strong film stress occurs in a nickel film and decreases the adhesion strength between a laminated metal electrode and a wafer, so that particularly a peel-off occurs at the interface between the titanium and the semiconductor wafer.

For the countermeasure, a method of obtaining an anchor effect and high adhesion strength by polishing wafer surface in a specific form as well as, for example, a method of reducing a nickel film stress as disclosed in the gazette of Japanese patent Application Laid-open No. 167890-1990 have been well-known.

However, the former method has a disadvantage such that the increased number of steps incurs higher cost and the polishing incurs crack failure.

On the other hand, the latter method can make the stress of a nickel film to less than $3 \times 10^8$ N/m$^2$ by controlling argon pressure to more than 12 mTorr and the substrate to a temperature of 100° C.–250° C., thus achieving a certain degree of effect. However, when the single wafer sputtering system or the like is used continuously and industrially, the temperature inside the system increases to 250° C. more. As a result, the nickel film stress becomes higher, thus causing peel-off at the bonded portion as well.

SUMMARY OF THE INVENTION

The present invention was made to overcome the above problems. It is an object of the present invention to provide a method of forming electrodes of a semiconductor device which can increase the adhesion between a Si substrate and a metal electrode without especially increasing the number of steps such as the formation of a surface with a roughness of specific shape on a Si substrate and without specially decreasing the stress of the nickel film.

In order to achieve the above object, the electrode forming method according to the present invention is characterized in that; in an electrode forming method for a semiconductor device which includes the steps of forming a contact metal film on a silicon substrate surface after subjecting it to a cleaning process using a reverse sputtering process by argon ion, and forming a nickel film as a soldering metal on the contact metal film, the number of the argon atoms per unit area at the interface between the silicon and the contact metal film is controlled to a predetermined value, that is, below $4.0 \times 10^{14}$ atoms/cm$^2$.

More concretely, when the substrate temperature for the formation of the contact metal film is less than about 350° C., the number of argon atoms per unit area at the interface is adjusted to below a predetermined value by controlling the output of the reverse sputtering during the cleaning process.

In addition, when by controlling the substrate temperature during the formation of the contact metal film to about more than 300° C., utilizing the diffusion, and the argon atom distribution at the interface between the silicon substrate and the contact metal film is dispersed, whereby the number of argon atoms per unit area at the interface is controlled to less than the predetermined value.

In this invention, the present inventors found the fact as a result of many experiments and considerations that in the substrate cleaning process being performed as a preliminary treatment to form a contact metal film on the surface of a silicon substrate, when the oxide film on a silicon substrate in dry process is intended to remove, the adhesion between the silicon substrate and the metal electrode is decreased remarkably. In the substrate cleaning process, it was found that argon atoms introduced into the silicon substrate are a factor which decreases the adhesion strength at the interface between the silicon substrate and the contact metal film in comparison with the strong film stress of a nickel film. The present invention was made based on the fact that vigorous studies by the present inventors found that the adhesion strength can make strong by controlling the amount of argon atoms at the interface.

That is, the natural oxide film grown on the surface of a silicon substrate is removed to clean the surface thereof by bombarding inert argon gas against the silicon substrate. In the cleaning process, the ion bombardment damages the surface of a silicon substrate and the silicon (Si) on the top surface of it makes into amorphous.

In this state, when a metal for ohmic contact such as titanium (Ti) is deposited, Si diffuses into Ti layer in the Si/Ti interface to form a Si-Ti amorphous layer, whereby the bonding of the Si/Ti interface is strengthened. However, at a substrate temperature of about 350° C. or less during the Ti deposition process, argon atoms (Ar) existing in the surface of the Si substrate cannot be easily diffused into Ti layer, but concentrate in the interface between the Si substrate and the Si-Ti amorphous layer.

Experiments and considerations by the present inventors found first that there are relationships between the amount of argon atoms which concentrate in the interface between the silicon substrate and the Si-Ti amorphous layer, and the bonding strength between an electrode and Si. In other words, a strong bonding between an electrode and Si can be maintained by making the amount of argon atoms in the interface to a predetermined value or less than about $4 \times 10^{14}$ atoms/cm$^2$ with respect to the film stress of the nickel film.

The amount of argon atoms which concentrate in the interface can be adjusted by controlling the output of argon ion reverse sputtering during the substrate cleaning process to control the energy of the argon ions.

On the other hand, the present invention was made based on the result that the present inventors found through many experiments and considerations that the adhesion strength between an electrode and Si can be increased by controlling the substrate temperature during sputtering when an electrode is formed by sputtering.

That is, when a metal for ohmic contact, for example, titanium (Ti) is deposited in the state in which the top surface of a silicon substrate is made into amorphous using cleaning process, argon atoms (Ar) existing on the surface of a Si substrate can be diffused into Ti layer during Ti depositing process at a substrate temperature of more than 300° C. Therefore Ti can be readily reacted with amorphous Si in the Si/Ti interface without concentrating argon in the interface between the Si substrate and the electrode layer, whereby a strong bonding between electrode and Si can be maintained.

According to the present invention, argon atoms in the interface between the silicon substrate and the contact metal film are controlled in amount, which is introduced into a silicon substrate during the substrate cleaning process and affects adversely to the adhesion strength between the electrode and Si. In other words, by the condition of the argon ion reverse sputtering in the substrate cleaning process, or the substrate temperature to at least 300° C. during the contact metal formation is controlled merely there is the excellent effect that the amorphous layer of Si and the contact metal is functioned as a strong bonding layer of the interface between electrode and Si substrate, whereby the adhesion strength between the si substrate and the metal electrode can be improved effectively.

DESCRIPTION OF THE PREFERRED EMBODIMENTS

First Embodiment

Figure 1:
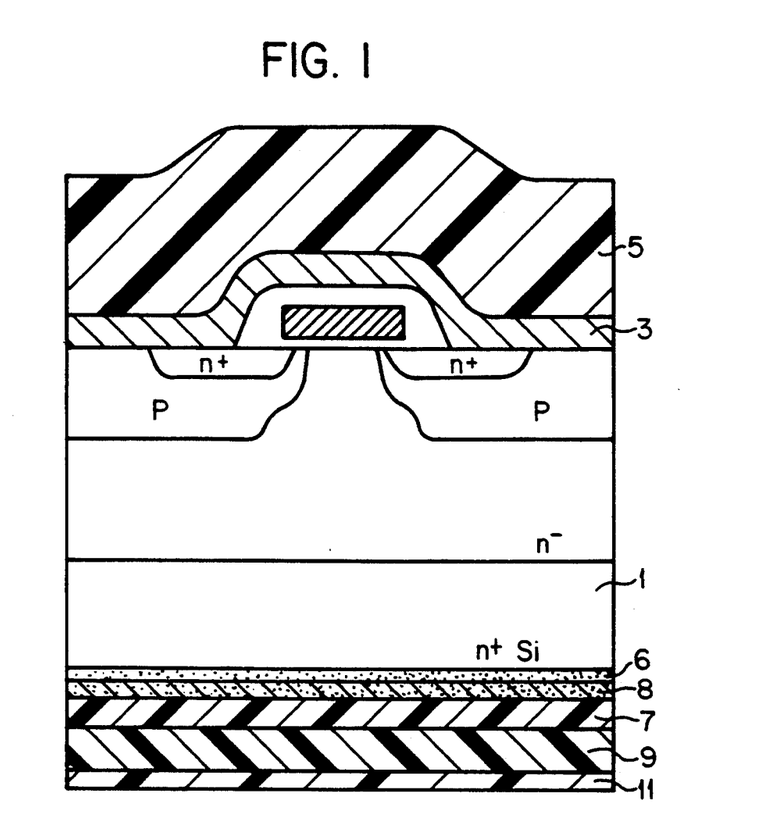
FIG. 1 is a vertical cross sectional view showing a semiconductor device (DMOS element) manufactured by applying an embodiment according to the present invention.

FIG. 1 is a vertical cross-sectional view showing a semiconductor device (DMOS element) manufactured by applying the first embodiment according to the present invention. The present embodiment will be explained below in conjunction with the manufacturing steps shown in FIG. 3. FIGS. 3(a) to 3(f) show diagrammatically and sequentially the step flows for manufacturing a laminated metal electrode according to the present embodiment.

Figure 3A:
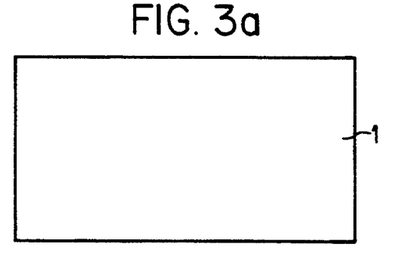
FIGS. 3(a) to 3(f) are cross-sectional views showing diagrammatically a laminated metal electrode manufactured by the first embodiment according to the present invention in order of the manufacturing steps.
Figure 3B:
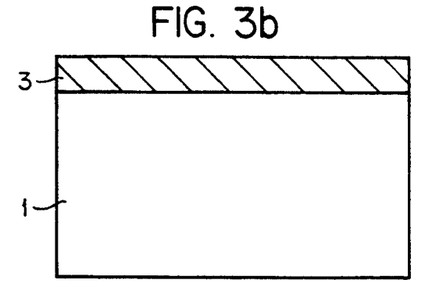
Figure 3C:
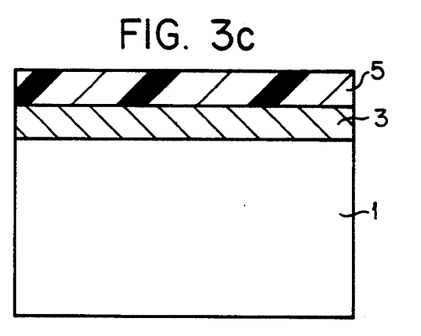

In FIG. 3(a), the predetermined gate and source regions (not shown) for a power MOS transistor, for example, are formed in a 5-inch diameter, 600 μm thick silicon (Si) substrate. Then, as shown in FIG. 3(b), an aluminum line 3 acting as a surface electrode is formed in a predetermined pattern. Next, as shown in FIG. 3(c), for example, a nitride silicon (SiN) layer 5 acting as a passivation film, is formed using plasma CVD process to protect the aluminum line 3.

Figure 2:
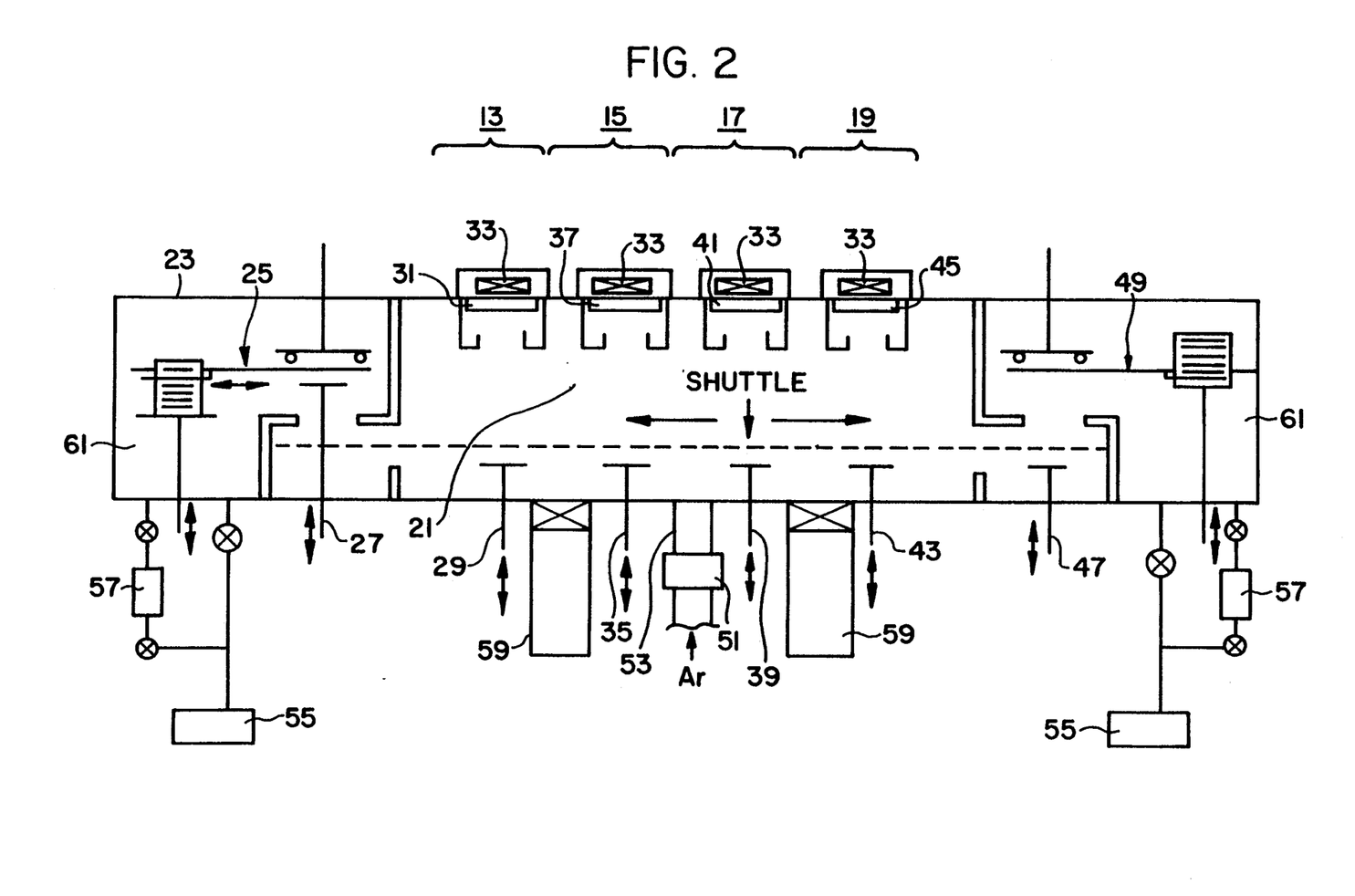
FIG. 2 is a structural diagram of a sputtering system used for the embodiment according to the present invention.

After element components have been formed on the surface side of the silicon substrate 1, the silicon substrate 1 is transferred to the sputtering system as shown in FIG. 2 to form a metal film working as the drain electrode of a MOS transistor on the back surface of the silicon substrate 1. The sputtering system shown in FIG. 2 is the XM-8 model, DC parallel plate magnetron sputtering system made by Varian Co. In this embodiment, the sputtering is performed under the conditions that the substrate temperature is about 20° C. and the pressure of argon (Ar) gas 21 introduced in the chamber 23 is 7.5 mTorr. The argon gas is introduced into the chamber 23 from the gas inlet 53 through the massflow meter 51. The argon pressure depends on the amount of argon supplied through the massflow meter as well as the vacuum degree achieved by a vacuum pump described later. In FIG. 2, the vacuum pump system comprises a rotary pump 55, a turbo pump 57, and a cryopump 59. In the vacuuming process, the rotary pump 55 conducts a rough evacuation, the turbo pump 57 conducts an intermediate evacuation and an evacuation of the lock chamber 61, and the cryopump 59 conducts a final evacuation.

In FIG. 2, first, the transferring lock table 27 receive a wafer from the transport 25, and in turn descends to transfer it to a shuttle (not shown). The shuttle is constructed so as to move along the broken line shown in FIG. 2, and first moves the received wafer onto the process table 29. In the station (etching chamber) 13, a RF power source is connected so as to apply the lower potential to the process table 29 and the higher potential (or ground potential) to the capture 31. In this embodiment, the sputtering is performed at a low output of 15 W for a short period of 90 seconds. The ionized Ar gas bombards the back surface of the silicon substrate 1, and etches the top surface of the back side by about 2.5 nm. The etching removes the natural oxide film of about 2 nm grown on the top surface as well as a contaminant such as carbon. The argon gas bombardment also converts the top surface of the silicon substrate into an amorphous. In the above sputtering condition, the amount of argon atoms existing in the amorphous Si layer was $2.0 \times 10^{14}$ atoms/cm$^2$. The capture 31 is used to collect contaminants (natural oxide film and the like) on the silicon surface. In FIG. 2, numeral 33 represents a magnet for enclosing electrical discharge.

Figure 3D:
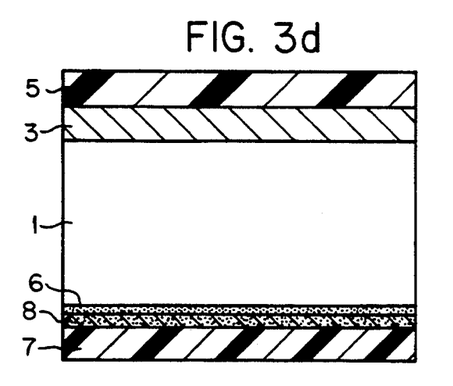

Next, a wafer is transferred in the station (Ti film forming chamber) 15 using the shuttle, and then placed on the process table 35. In the station 15, a DC power source is connected so as to apply the higher potential (or ground potential) to the process table 35 and the lower potential to the target 37 containing titanium (Ti). In this state, a sputtering is performed under the condition of the output of 2 kW for 75 seconds. The ionized argon gas bombards the target 37 and Ti atoms sputtered out of the target 37 are deposited on the silicon substrate 1 to form a Ti film 7 of a thickness of about 250 nm. On the way of the deposition process, an Si-Ti amorphous layer 8 is formed in the interface between the silicon substrate 1 and the Ti film 7, as shown in FIG. 3(d). In FIG. 3(d), numeral 6 represents an amorphous Si layer containing Ar atoms.

Figure 3E:
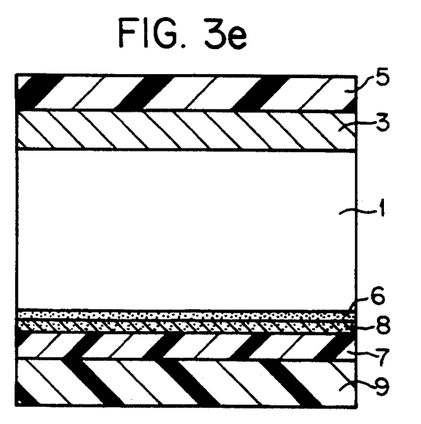

Next, the wafer is transferred into the station (Ni film forming chamber) 17 using the shuttle and then arranged it on the process table 39. In the similar manner to that performed at the station 15, a DC power source in the station 17 is connected so as to apply the higher potential to the process table 39 and the lower potential to the target 41 containing nickel (Ni). In this state, Ar gas ionized by sputtering at an output of 1 kW for 240 seconds bombards the target 41. The Ni atoms sputtered out of the target 41 are deposited on the Ti film 7 to form a Ni film 9 having a thickness of about 600 nm, as shown in FIG. 3(e).

Figure 3F:
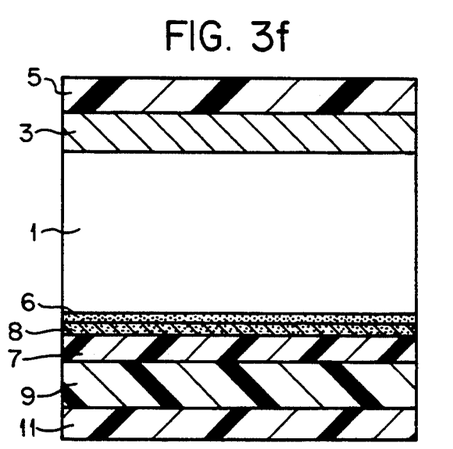

The wafer is transferred to the station (Au film forming chamber) 19 using the shuttle and then arranged on the process table 43. In the station 19, a DC power source is connected so as to apply the higher potential to the process table 43 and the lower potential to the target 45 containing gold (Au). In this state, Au atoms are deposited on the Ni film 9 by sputtering at the output of 0.5 kW for 12 seconds to form an Au film 11 of about 50 nm thick, as shown in FIG. 3(f).

In such a manner, the wafer on which Ti, Ni, Au are deposited sequentially to form a back electrode on the back surface is sent to the transfer lock table using the shuttle, and is send to the transport 49 through the lifting operation of the transfer lock table. Thereafter, the semiconductor device is manufactured as shown in FIG. 1.

In the above explanation, the detailed structure of the power MOS transistor has been omitted. The structure may be applied for bipolar elements, diodes and the like, in addition to the well-known MOS structures.

Next, an explanation will be made as for the mechanism of the adhesion between Si and Ti in the structure shown in FIG. 1 manufactured according to the above manufacturing process.

Figure 4:
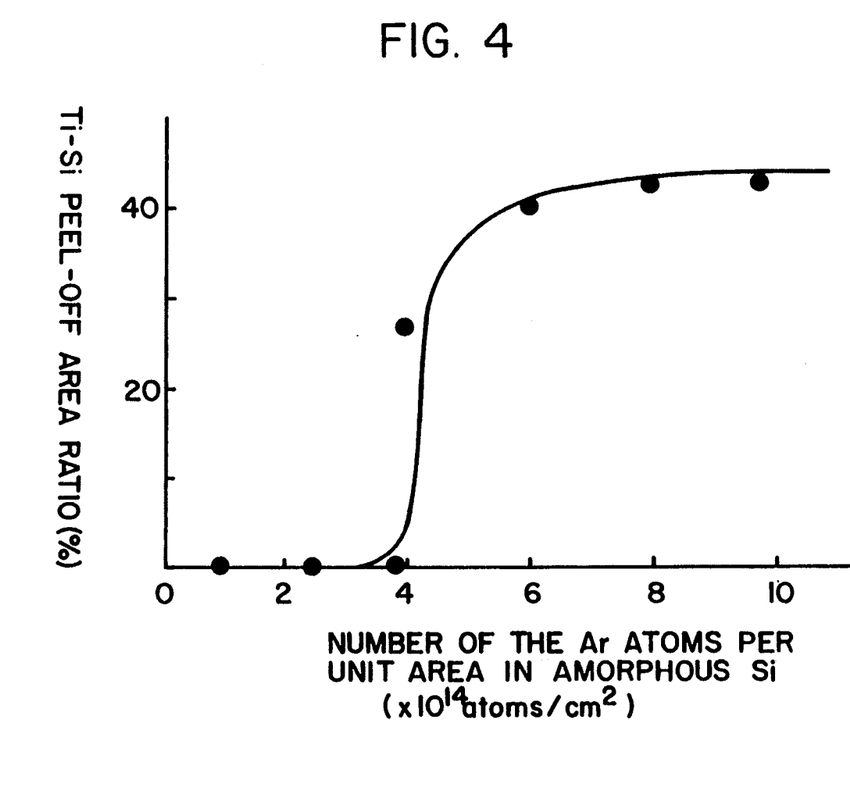
FIG. 4 is a characteristic diagram showing the relationship between the number of Ar atoms per unit area and Ti-Si peel-off area ratio.

FIG. 4 shows the relationships between the number of argon atoms per unit area, existing in a Si substrate during an argon etching which is performed prior to the Ti film deposition in the step shown in FIG. 3(d), and the results of peeling-off test which is done to the back electrode of Ti, Ni, Au formed actually. As well-known, the peeling-off test is a method of pasting an adhesive tape on the back of a 5 mm square chip (adhesion strength of about 80 N/m) and then examining the state of the chip from which the adhesion tape is peeled off.

As obvious from FIG. 4, there is a relationship between the amount of remaining argon atoms per unit area and the Si-Ti peeling. When the number of argon atoms per unit area is less than about $4.0 \times 10^{14}$ atoms/cm$^2$ the Si-Ti is not peeled off because of the strong adhesiveness. However, when the number of argon atoms exceeds about $4.0 \times 10^{14}$ atoms/cm$^2$ the peeling occurs FIG. 4 shows the results in the case of the substrate temperature of 20° C. The same result as that seen in FIG. 4 was obtained even by forming the electrode at the substrate temperature of about 350° C. It was been confirmed the fact that the peeling between Si and ti does not occur when the number of argon atoms per unit area is less than about $4.0 \times 10^{14}$ atoms/cm$^2$.

Figure 5:
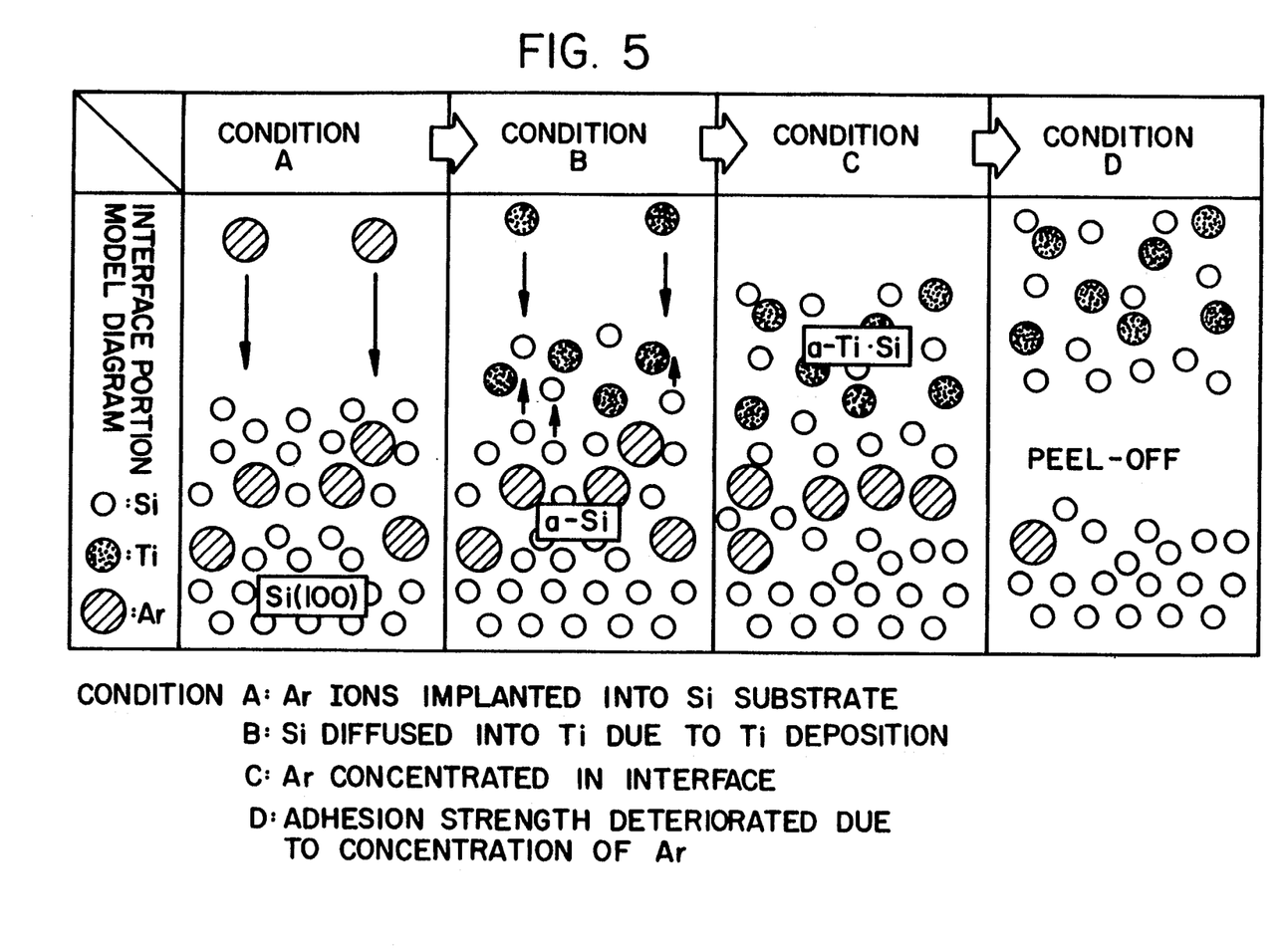
FIG. 5 is a model diagram showing the peeling mechanism of a Ti-Si interface.

That reason is considered that, as shown in the peeling model diagram of FIG. 5, the silicon atoms in the substrate surface diffuse easily into a Ti film during the Ti film deposition, but the argon atoms diffused into the substrate during the reverse sputtering process do not diffuse and concentrate in the interface between a Si-Ti diffusion layer and a Si substrate, so that the argon atoms concentrated in the interface which does not contribute the bonding between Si and Ti deteriorates the adhesion strength, thus causing peeling. The amount of argon atoms in the range where the peeling does not occur with respect to the stress of a Ni film exists. When the number of argon atoms per unit area, existing in the silicon substrate, is less than about $4.0 \times 10^{14}$ atoms/cm$^2$, a strong adhesion strength can be obtained because of the small amount of argon atoms. However, when the number of Ar atoms exceeds the above mentioned value, it is considered that the peeling-off occurs due to the Ar concentration at the interface. As described later, when the substrate temperature is over about 350° C., argon can be diffused. However it is desirable that the number of Ar atoms existing in the interface covers the above mentioned range.

This mechanism can be supported by performing micro-analysis of peeled surfaces.

Table 1 shows the results obtained by analyzing the peeled surfaces of Si/Ti layer which is formed at a substrate temperature of 20° C. and has the argon atom amount of $6.0 \times 10^{14}$ atoms/cm$^2$ remaining in the silicon substrate, using X-ray Photoelectron Spectroscopy.

TABLE 1

|  | Si(2P) | Ti(2P) | Ar(2P) | O(1S) | C(iS) |
|---|---|---|---|---|---|
| Analytical Intensity of Ti Side | 1.00 | 8.20 | <0.01 | 7.40 | 1.19 |
| Analytical Intensity of Si Side | 1.00 | 0.02 | 0.07 | 1.05 | 0.06 |

(The results were evaluated mutually with respect to the peak intensity of Si(2P) as a reference.)

As seen from Table 1, Ar, Si, C, and O are detected from the Si side, while Ti, Si, C, and O are detected from the Ti side. It can be confirmed that the fact that Ar atoms are not detected at the Ti side means that they cannot be diffused into Ti layer. In this case, it is considered that C and O detected are contents in the air absorbed during the analysis.

As described above, according to the above first embodiment, when the top surface of a substrate is cleaned by performing an Ar reverse sputtering prior to the deposition of the Ti film 7, the number of argon atoms per unit area introduced into the silicon substrate is adjusted to less than $4.0 \times 10^{14}$ atoms/cm$^2$, that is, $2.0 \times 10^{14}$ atoms/cm$^2$ by controlling the sputtering condition. Hence even if Ar atoms which does not contribute to the bonding of the Si/Ti interface concentrates during the deposition of the Ti film 7, a strong bonding can be maintained by the Si-Ti amorphous layer 8 without affecting the Si-Ti bonding, whereby the bonding between Si and Ti can be made strong sufficiently with respect to the film stress of the Ni film 9.

In this case, it is not necessary not only to make the substrate with special rough back surface, but also to increase the number of the steps. Furthermore, since the natural oxide film on the back surface of a substrate is removed using Ar reverse sputtering without etching with HF-based etchant, it is possible to remove contamination due to organic material such as carbon without requiring an increased number of steps and a large sized manufacturing apparatus. The adhesion strength obtained at the Si-Ti amorphous layer does not require any annealing step for improving adhesion strength after the formation of a Ti/Ni/Au film. As a result, it is possible to prevent an increased number of steps because of additional thermal processing, Au spiking of Ni, and solder wetting failure caused by diffusion and oxidation to the top surface. In addition, it Can be prevented that the thermal processing causes a degraded adhesion strength due to the alloy layer with many voids formed between Ti film and Ni film as well as a large warp of wafer. Still furthermore, since a strong bonding can be achieved even at a lower substrate temperature of, for example, 20° C. during a formation of an electrode on the back surface, the aluminum electrode line formed on the surface of a silicon substrate is not deteriorated thermally.

Second Embodiment

Next, the second present embodiment will be explained according to the manufacturing steps referring to FIG. 6. FIGS. 6(a) to 6(f) show diagrammatically a laminated metal electrode formed according to the present embodiment in the order of the manufacturing steps. Like numerals are provided to the same elements as those seen in the first embodiment.

Figure 6A:
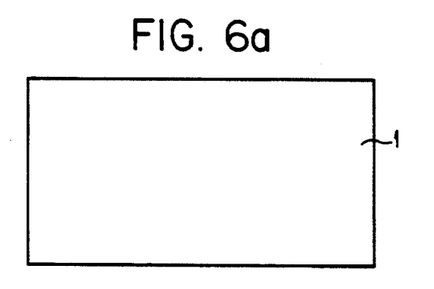
FIGS. 6(a) and 6(f) are cross-sectional views showing a laminated metal electrode manufactured according to the second embodiment of the present invention in order of the manufacturing steps.
Figure 6B:
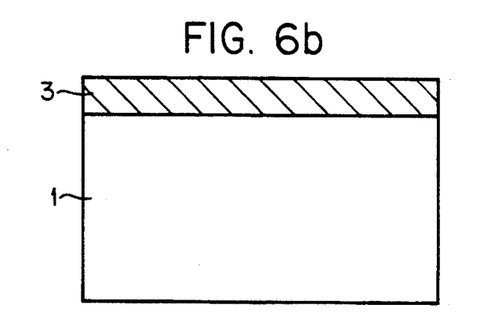
Figure 6C:
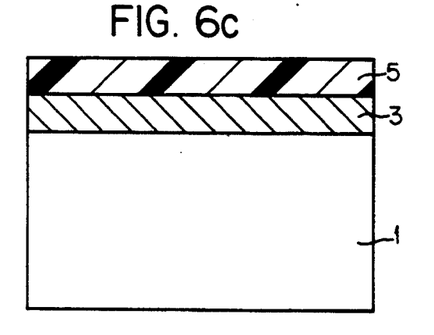

First, referring FIG. 6(a), in the same manner as in the first embodiment, after the predetermined source and drain regions (not shown) for a power MOS transistor are formed in a silicon (Si) substrate 1 of, for example, 5 inch in diameter and 600 μm in thickness, an aluminum line 3 acting as a surface electrode is formed in a predetermined pattern, as shown in FIG. 6(b). Next, as shown in FIG. 6(c), for example, a nitride silicon (SiN), acting as a passivation film is formed using plasma CVD process to protect the aluminum line 3.

In such a manner after, the element components have been formed on the surface side of the silicon substrate 1, the silicon substrate is transferred to the sputtering system as shown in FIG. 2 to form a metal film for the drain electrode of the MOS transistor on the back surface of the silicon substrate 1. In this embodiment, the pressure of the argon (Ar) gas 21 supplied into the chamber 23 is 5 mTorr.

Figure 7:
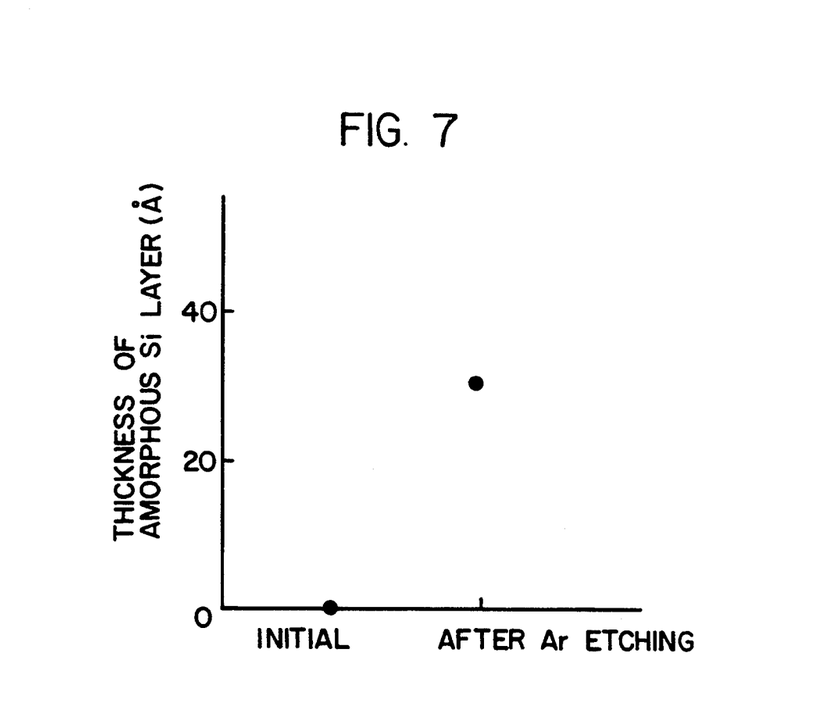
FIG. 7 is a diagram showing the thickness of an amorphous Si layer existing in the surface of a silicon substrate before and after an Ar reverse sputtering process.

First, the sputtering condition differs from that of the first embodiment. In the station (etching chamber) 13, the sputtering is carried out under the condition that an output for stable electric discharge is 70 W and a sputtering time is 180 seconds. The ionized argon (Ar+) gas bombards the back surface of the silicon substrate 1 and etches the back surface by about 180Å. The etching removes the natural oxide film grown on the back surface and contamination by carbon or other element. In this time, as shown in FIG. 7, amorphous Si layer due to a damage from the etching exists in the back surface of the substrate.

Figure 6D:
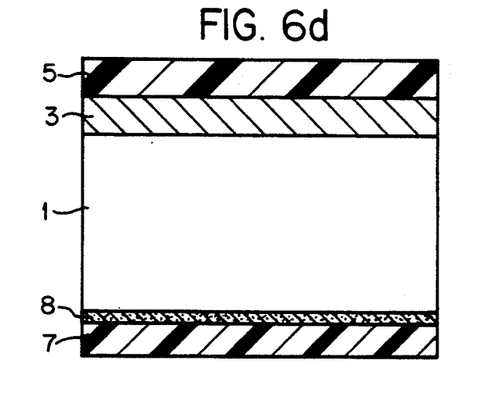

Next, the substrate 1 is heated at a substrate temperature of 300° C. to 500° C., for example, 400° C., in the station (Ti film forming chamber) 15 which is equipped with a heater (not shown). A Ti film 7 of about 250 nm thick is formed on the silicon substrate 1 by sputtering under the condition of at 2 kW for 75 seconds which is the same as that in the first embodiment. On the way of the deposition, the Ar atoms implanted into the silicon substrate are diffused by the substrate heating process using the heater and, the above mentioned damage layer or the amorphous Si layer disappears. As a result, as shown in FIG. 6(d), the Si-Ti amorphous layer 8 is formed at the interface between the silicon substrate 1 and the Ti film 7.

Figure 6E:
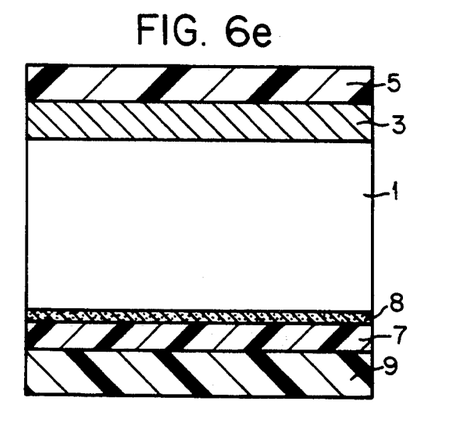

Next, in the same manner as that in the first embodiment, a sputtering is performed at 1 kW for 240 seconds in the station (Ni film forming chamber) 17 to form a Ni film 9 with a thickness of about 600 nm as shown in FIG. 6(e).

Figure 6F:
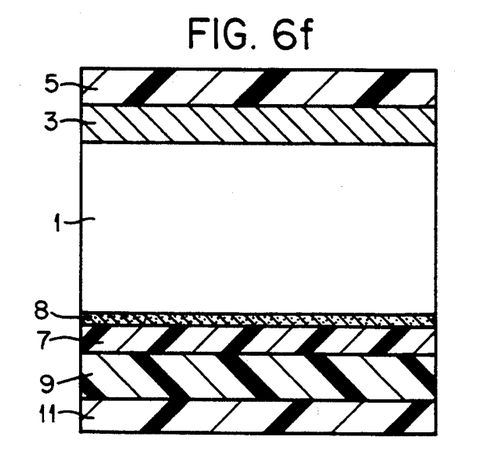

Furthermore, in the same manner as that in the first embodiment, a sputtering is carried out at 0.5 kW for 12 seconds in the station (Au film forming chamber) 19 to form an Au film 11 with a thickness of about 50 nm on the Ni film 9, whereby a semiconductor device shown in FIG. 1 is made as shown in FIG. 6(f).

Next, an explanation will be made as for the mechanism of the adhesion between Si layer and Ti layer in the present second embodiment.

Figure 8:
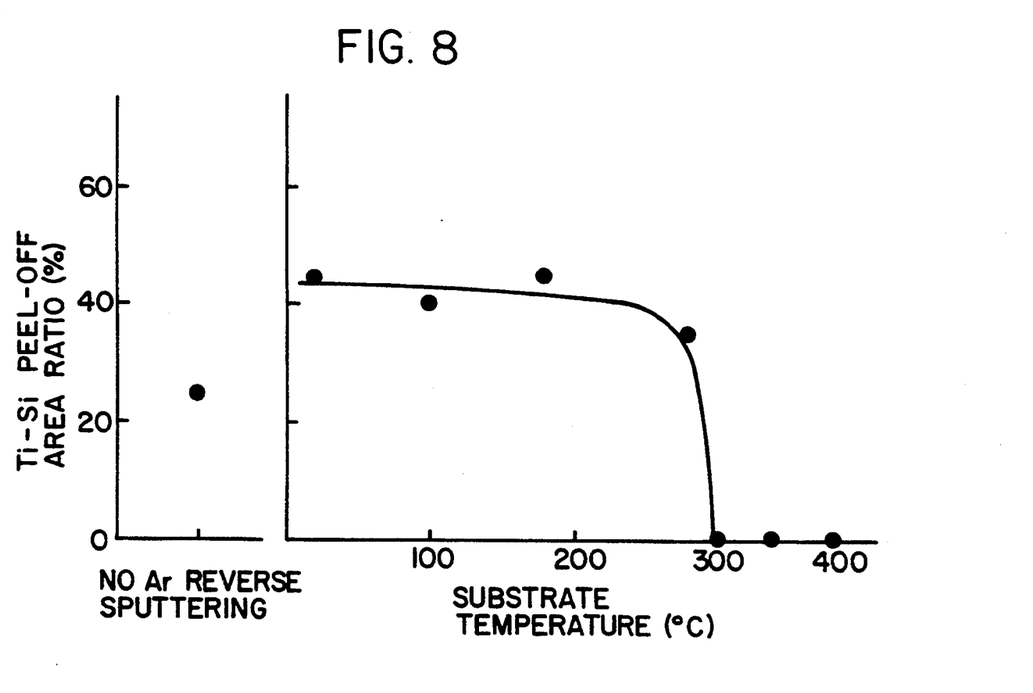
FIG. 8 is a characteristic diagram showing the relationships between substrate temperature and Ti-Si peel-off area ratio.

FIG. 8 shows the relationship between the substrate temperature determined by means of a heater for Ti film deposition during the step shown in FIG. 6(d), and the results of the peeling-off test to the back electrode of Ti, Ni, and Au formed actually. The reverse sputtering is carried out under the condition for the step shown in FIG. 6(d). FIG. 8 also shows the result of the peeling-off test where the substrate back etching using Ar reverse sputtering was not performed prior to the Ti film deposition.

As seen clear from FIG. 8, in case where the back surface of a substrate is cleaned through a reverse sputtering, while it is converted into an amorphous and a Ti film is deposited at a substrate temperature of 300° C. or more, no peeling between Si layer and Ti layer occurs, but strong bonding can be obtained. However, when either no reverse sputtering or a reverse sputtering performed at the substrate temperature of less than 300° C. without controlling the output thereof like the first embodiment is carried out, a peeling occurs.

Figure 9A:
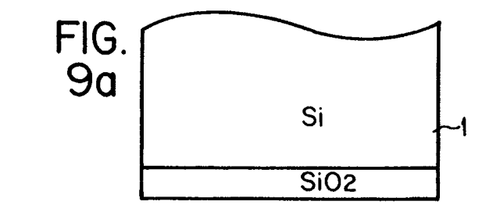
FIG. 9 is a diagram explaining the junction mechanism of a Si-Ti interface.
Figure 9B:
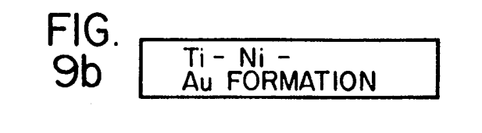
Figure 9C:
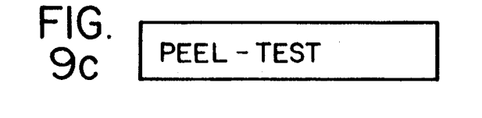
Figure 9D:
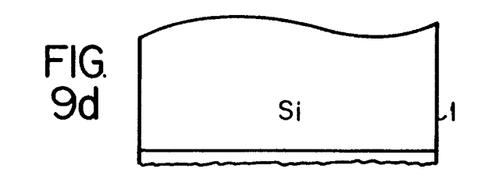
Figure 9E:
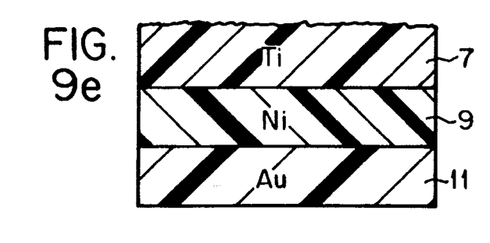
Figure 9F:
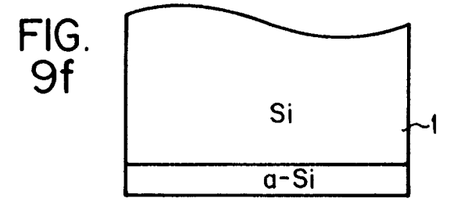
Figure 9G:
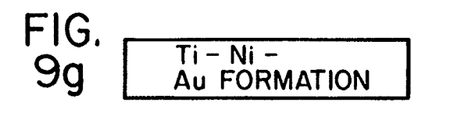
Figure 9H:
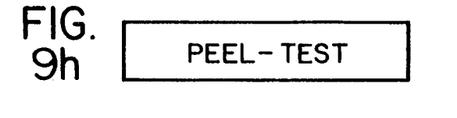
Figures 9I, 9J:
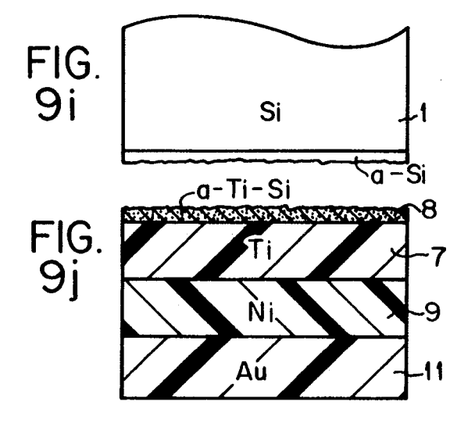
Figure 9K:
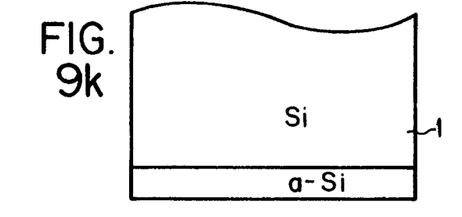
Figure 9L:
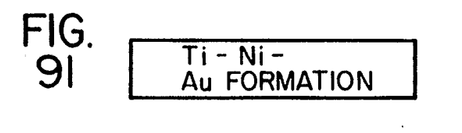
Figure 9M:
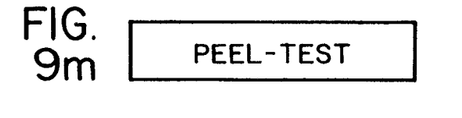
Figure 9N:
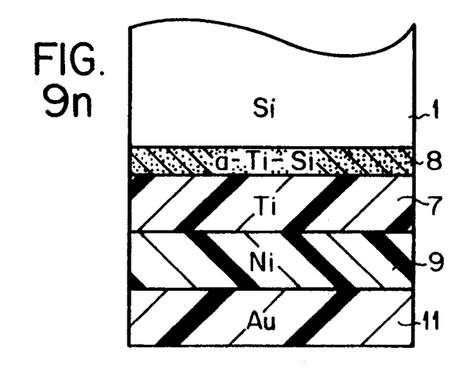

In the case of no argon reverse sputtering, since the top surface of the silicon substrate 1 is $SiO_2$, as shown in FIG. 9(a), it does not react with the Ti film 7, whereby a film peeling occurs. On the other hand, in case where an Ar sputtering is performed, the natural oxide film $SiO_2$ groom on the top surface of the silicon substrate 1 is removed but the top surface thereof is damaged. As explained regarding the first embodiment in conjunction with FIG. 5, the top surface is converted into an amorphous Si. The Si/Ti interface does not make in nature a titanium silicide with a strong bond at a temperature of less than 550° C. However, since the amorphous Si layer being a layer damaged by the reverse sputtering reacts easily with Ti, a strong bonding layer or a Si-Ti amorphous layer 8 can be formed easily even at a lower temperature. In the first embodiment, the reverse sputtering is determined on condition that the amount of Ar atoms at the electrode/Si interface is less than $4.0 \times 10^{14}$ atoms/cm$^2$. But in the case where a special measure for the argon revere sputtering is not taken, as shown in the present embodiment, it is considered that argon atoms which concentrates at the interface between Si and Si/Ti amorphous layer diffuses easily into the Ti film when the substrate temperature is more than 300° C. As a result, as shown in FIG. 9(c), it is considered that the strong adhesiveness does not cause a film peeling. However, as explained regarding the first embodiment referring to FIG. 5, it is considered that since the substrate temperature is less than 300° C., the presence of the amorphous Si layer or Ar atoms in the amorphous Si layer decreases the strength, a film peeling occurs, as shown in FIG. 9(b).

As described above, according to the second embodiment, the back surface electrode is formed at a substrate of 300° C. to 500° C. after the top surface of a substrate is cleaned using Ar reverse sputtering prior to a deposition of the Ti film 7. Hence in a Ti deposition process to the silicon substrate 1, since Ti reacts easily with the amorphous Si layer existing in the top surface of a Si substrate, an amorphous layer of Si-Ti is formed, while the Ar atoms existing in amorphous Si layer are distributed through diffusion. As a result, the number of Ar atoms which remain in the interface between the Si substrate and the contact metal film is less than $4.0 \times 10^{14}$ atoms/cm$^2$ and the junction between-Si layer and Ti layer can be made strong sufficiently with respect to the film stress of the Ni film 9, in no relation with the absolute amount of Ar introduced into the Si substrate. In this case, since the substrate temperature during Ti deposition is less than 500° C., the heat deterioration of an aluminum electrode formed on the surface of a silicon substrate does not occur.

In the first and second embodiments of the Ti layer 7 is formed as an example to make an ohmic contact with the surface of a wafer. However, instead of Ti, for example, chrome (Cr), vanadium (V), zirconium (Zr), aluminum (Al), or gold (Au) may be formed for an ohmic contact. The thickness of Ti film can be 100 nm to 400 nm, without being limited to 250 nm. The thickness of the Ni layer can be 200 nm to 1000 nm, without being limited to 600 nm.

The first and second embodiments show that not only Ti film 7 but also Ni film 9 and Au film 11 are formed at the same substrate temperature as that for a deposition of the Ti film 7. However, as disclosed on the Japanese Patent Laid-Open No. 167890-1990, it is considered that the effect of the present invention is improved further if the film stress of a Ni film is made less than $3 \times 10^8$ N/m$^2$ by controlling accurately the substrate temperature to 100° C. to 250° C. and the Ar pressure during a Ni film formation to more than 12 mTorr.

Furthermore, in the substrate cleaning process by Ar reverse sputtering, the number of Ar atoms existing in the Si substrate may be less than $4.0 \times 10^{14}$ atoms/cm$^2$ as shown in the first embodiment and the substrate temperature may be determined more than about 300° C. only during Ti film formation as shown in the second embodiment. Furthermore, as disclosed in the laid-open Japanese Patent Application Laid-Open No. 167890-1990, a Ni film may be formed on the structure obtained above.

What is claimed is:

1. A method of forming electrodes of a semiconductor device comprising the step of:
   forming a contact metal film on a surface of a silicon substrate after performing a cleaning process using a reverse sputtering of argon ions, and then forming a nickel film as a soldering metal on said contact metal film; and controlling the amount of argon atoms at the interface between said silicon substrate and said contact metal film to be less than $4.0 \times 10^{14}$ atoms/cm$^2$.

2. An electrode forming method for a semiconductor device according to claim 1, wherein said controlling step comprises the step of controlling the number of argon atoms at said interface by controlling the output of the reverse sputtering in said cleaning process.

3. An electrode forming method for a semiconductor device according to claim 4, wherein said contact metal film comprises one selected from the group of titanium, vanadium, chrome, zirconium, and gold.

4. An electrode forming method for a semiconductor device according to claim 1, further comprising the step of forming a final electrode on said nickel film.

5. A method for forming electrodes for a semiconductor device comprising:
   a first step of bombarding inert gas ions against a surface of a silicon substrate to remove a natural oxide film grown on the surface of said silicon substrate whereby the top surface is converted into an amorphous layer;
   a second step of forming a contact metal film on said surface of said silicon substrate at a predetermined substrate temperature of more than 300° C.; and
   a third step of forming a nickel film as a soldering metal on said contact metal film.

6. An electrode forming method for a semiconductor device according to claim 5, further comprising a fourth step of forming a final electrode on said nickel film after said third step.

7. An electrode forming method for a semiconductor device according to claim 5, wherein said contact metal film comprises one selected from the group of titanium, vanadium, chrome, zirconium, and gold.

8. An electrode forming method for a semiconductor device according to claim 5, wherein said predetermined substrate temperature at which said contact metal film is formed is less than 500° C.

9. An electrode forming method for a semiconductor device according to claim 5, wherein said inert gas ions bombarding said substrate are derived from argon.

10. A method of forming electrodes of a semiconductor device comprising the steps of:
    performing a cleaning process which removes a natural oxide film formed on a silicon substrate by performing a reverse sputtering using argon ions;
    forming a contact metal film on a surface of said silicon substrate;
    forming a nickel film as a soldering metal on said contact metal film; and
    controlling the amount of argon atoms distributed at the interface between said silicon and said contact metal film to a value of less than about $4.0 \times 10^{14}$ atoms/cm$^2$.

11. An electrode forming method for a semiconductor device according to claim 10 wherein said controlling step comprises a step of setting the output of said reverse sputtering in said cleaning step in the manner that the amount of the argon atoms which exist in said silicon substrate surface after said cleaning step is less than about $4.0 \times 10^{14}$ atoms/cm$^2$.

12. An electrode forming method for a semiconductor device according to claim 11, wherein the substrate temperature is set at less than about 300° C. when said contact metal film is formed.

13. A method of forming electrodes of a semiconductor device according to claim 10, wherein said controlling step comprises a step of setting the substrate temperature at more than about 300° C. during the formation of said contact metal film in such a manner that the amount of argon atoms is less than about $4.0 \times 10^{14}$ atoms/cm$^2$, which exist in the interface between said silicon and said contact metal film after said contact metal film has been formed.

14. A method of forming electrodes of a semiconductor device according to claim 13, wherein said substrate temperature is less than about 500° C.

15. An electrode forming method for a semiconductor device according to claim 11, wherein said contact metal film is one selected for the group of titanium, vanadium, chrome, and zirconium.

16. An electrode forming method for a semiconductor device according to claim 13, wherein said contact metal film is one selected from the group of titanium, vanadium, chrome, and zirconium.

17. An electrode forming method for a semiconductor device according to claim 11, further comprising the step of forming a final electrode on said nickel film.

18. An electrode forming method for a semiconductor device according to claim 13, further comprising the step of forming a final electrode on said nickel film.

19. An electrode forming method for a semiconductor device according to claim 2, wherein the substrate temperature during said contact metal film forming is less than about 350° C.

* * * * *